United States Patent [19]
Li et al.

[11] Patent Number: 5,841,701
[45] Date of Patent: Nov. 24, 1998

[54] METHOD OF CHARGING AND DISCHARGING FLOATING GAGE TRANSISTORS TO REDUCE LEAKAGE CURRENT

[75] Inventors: Xiao-Yu Li, San Jose; Radu Barsan, Saratoga; Sunil Mehta, San Jose, all of Calif.

[73] Assignee: Advanced Micro Devices, Inc., Sunnyvale, Calif.

[21] Appl. No.: 785,096

[22] Filed: Jan. 21, 1997

[51] Int. Cl.$^6$ ................................................ G11C 11/34
[52] U.S. Cl. .................... 365/185.28; 365/185.19
[58] Field of Search ..................... 365/185.19, 185.26, 365/185.28

[56] References Cited

U.S. PATENT DOCUMENTS

| | | | |
|---|---|---|---|
| 4,434,478 | 2/1984 | Cook et al. | 365/185.28 |
| 5,491,657 | 2/1996 | Haddad et al. | 365/185.26 |
| 5,517,470 | 5/1996 | Zanders et al. | 365/185.28 |
| 5,561,620 | 10/1996 | Chen et al. | 365/185.26 |

*Primary Examiner*—David C. Nelms
*Assistant Examiner*—Micahel T. Tran
*Attorney, Agent, or Firm*—Fliesler, Dubb, Meyer & Lovejoy, LLP

[57] ABSTRACT

A method for improving the endurance and reliability of a floating gate transistor often used in memory applications by controlling the electric field induced across the tunnel oxide region of the floating gate when discharging electrons from the floating gate. The method comprises the steps of: allowing the active region to ground; and applying a program voltage to the floating gate over a period of time and at a magnitude, by increasing the voltage from zero volts to the magnitude over a first period of at least 1 millisecond (ms.), maintaining the voltage at the magnitude for a second period of around 10 ms.–100 ms. sufficient to place charge on the floating gate, and decreasing the voltage from the magnitude during a third period to zero volts in not greater than 50 microseconds.

19 Claims, 4 Drawing Sheets

METHOD OF CHARGING AND DISCHARGING FLOATING GAGE TRANSISTORS TO REDUCE LEAKAGE CURRENT

BACKGROUND OF THE INVENTION

1. Field of the Invention

The invention relates to the operation of non-volatile memory transistors useful in memory arrays and programmable logic devices.

2. Description of the Related Art

Floating gate MOS transistors making use of Fowler Nordheim tunneling of electrons are useful in a plurality of applications, particularly programmable memory devices such as EPROMs and EPALs, and memory applications such as flash EEPROM devices. In typical applications, a large number of floating gate MOS transistors are formed onto a substrate in an integrated circuit thereby forming a high-density memory array. The reliability of such an array of programmable memory devices is generally dependent upon the failure of single, isolated bits in the array.

FIG. 1A shows a typical floating gate transistor 10 having: source 12 and drain 14, which may be formed of N+ doped regions; floating gate 15, which may be formed of a group I polysilicon; control gate 16, which may be formed of a group II polysilicon; and dielectric oxide layer 18.

The floating gate transistor 10 is charged and discharged in accordance with its use in the particular application. In order to charge or program a particular floating gate transistor, a programming voltage $V_{pp}$, on the order of 12–20 volts, is applied to the control gate electrode 16, while source 12 and drain 14 are held at ground or allowed to float. Upon applying $V_{pp}$ to the control gate 16, capacitive coupling between the control gate 16 and the floating gate 15 causes the floating gate 15 to acquire electrons from the drain region 14 through the process of Fowler-Nordheim tunneling. When $V_{pp}$ is removed, the floating gate 15 assumes a negative voltage due to the presence of the trapped electrons on the floating gate 15.

Discharge of electrons from the floating gate is generally accomplished by grounding the control gate 16, and applying the programming voltage $V_{pp}$ to the drain 14 while allowing the source 12 to float.

Perhaps the most important concern is data retention capability of EEPROM cells. Data retention is defined as the length of time a particular cell can retain information stored in the form of charge on the gate. It is believed that charged oxide traps are created during the Fowler Nordheim process. These oxide traps enable electrons to tunnel through the oxide at lower than expected energy band levels, and result in the so called "low voltage leakage current". The low voltage leakage current arises when electrons traverse the tunnel oxide when no voltage is applied to the cell and comprises a small amount of current leakage eventually resulting in a total discharge of the cell. It is therefore desirable to reduce or eliminate the low voltage leakage current.

The low voltage leakage current is dependant upon the quality of the oxide layer. The quality of the $SiO_2$ tunneling dielectric is a function of the amount of charge which can be made to pass through the dielectric before breakdown of the floating gate occurs. This is normally referred to as "fluence" or $Q_{BD}$. When the term "endurance" is used with respect to a memory array, the term refers to the length of time the particular array will function before a failure in a "weak" bit occurs.

It is thus an object of the invention to improve the reliability of a floating gate transistor.

It is a further object of the invention to improve the data retention characteristics of a memory array using floating gate transistors.

It is another object of the present invention to provide the above objects in an electrically erasable programmable memory cell.

It is a further object of the invention to improve the endurance of a floating gate transistor by controlling the tunneling current through the dielectric layer of the transistor during discharge of the floating gate.

It is a further object of the invention to provide the above objects in a floating gate transistor configuration which optimizes the electric field potential at the tunnel region of the dielectric insulating layer during discharge of the floating gate.

SUMMARY OF THE INVENTION

The invention comprises a method for improving the endurance and reliability of a floating gate transistor often used in memory applications. Specifically, a method for controlling the electric field induced across the tunnel oxide region of a floating gate memory transistor when discharging electrons from the floating gate. By controlling the electric filed across the tunnel region of a particular floating gate apparatus during the charge and discharge of electrons from the floating gate, the oxide traps in the tunnel oxide are neutralized and the effect of the low voltage leakage current reduced.

In one aspect, the method, generally described, comprises the steps of: allowing the active region to ground; and applying a program voltage to the floating gate over a period of time and at a magnitude, by increasing the voltage from zero volts to the magnitude over a first period of at least 1 millisecond, maintaining the voltage at the magnitude for a second period of around 10 ms.–100 ms. sufficient to place charge on the floating gate, and decreasing the voltage from the magnitude during a third period to zero volts in not greater than 50 microseconds.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

Figure 1A:
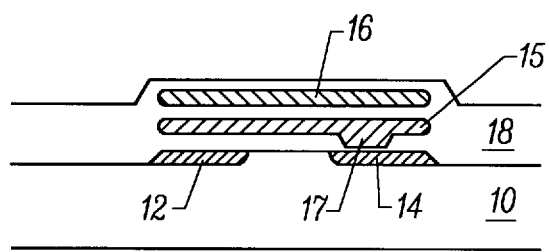
FIG. 1A is a schematic diagram of a configuration of a floating gate transistor.
Figure 1B:
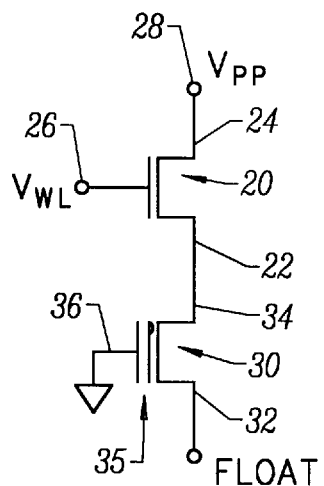
FIG. 1B is a schematic diagram showing a floating gate transistor in an electrically erasable, programmable, read only memory ($E^2$PROM) demonstrating a prior-art method for discharging a floating gate transistor in an $E^2$PROM.

With reference to FIG. 1B, a floating gate transistor 30 is shown in a typical E²PROM cell. The E²PROM cell generally comprises the floating gate transistor 30 with source 32, drain 34, and control gate 36, and a MOS select transistor 20 having source 22, drain 24, and gate 26.

For purposes of this discussion and the examples shown herein, the floating gate transistor 30 is assumed to have an intrinsic threshold voltage of $V_{TO}$ of about 0 V. The charged threshold value $V_{TC}$ is, therefore, greater than zero and the discharged threshold value $V_{TD}$ is less than zero, due to the presence and absence, respectively, of charge on the floating gate. In practice, an intrinsic $V_{TO}$ of about 0 V is not essential; the intrinsic $V_{TO}$ of the floating gate can be either positive or negative.

FIG. 1B demonstrates the prior-art method for discharging the electrons stored on the floating gate 35 of a floating gate transistor 30 when used in an E²PROM cell. A program voltage $V_{pp}$ on the order of 12–20 volts is applied to the drain electrode of select transistor 20. Typically, gate 26 of the select transistor 20 is generally coupled to a word line (not shown) of an array of E²PROM cells. A voltage $V_{wl}$, greater than or equal to the programming voltage $V_{pp}$, is applied to the gate 26 of the select transistor via the word line rendering select transistor 20 conductive. The gate 36 of floating gate transistor 30 is held at ground while the source 32 of floating gate transistor 30 is allowed to float or also held at ground. Upon application of $V_{pp}$ and $V_{WL}$, the electrons will be discharged from the floating gate transistor 30.

Figure 1C:
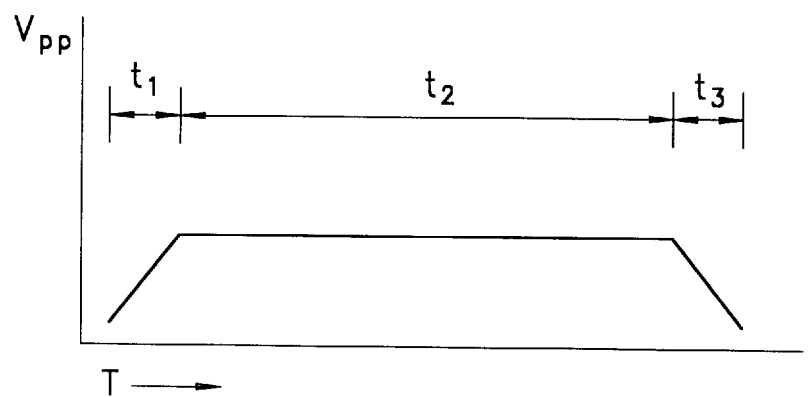
FIG. 1C is a graph of the program voltage Vpp versus time for the method of charging and discharging a memory cell in accordance with the prior art.

FIG. 1C shows the typical profile of a program voltage $V_{pp}$ magnitude versus time during programming of the transistor 30 shown in FIG. 1B. As shown therein, the ramp-up time $T_1$, is roughly equivalent to the ramp-down time $T_3$ of the program voltage $V_{pp}$. The duration $T_2$ of the maximum $V_{pp}$ applied is determined by the physical design characteristics of the cell.

This typically results in an electric field across the floating gate ($E_{pp}$) which has a profile roughly matching the voltage profile shown in FIG. 1C.

Figure 2:
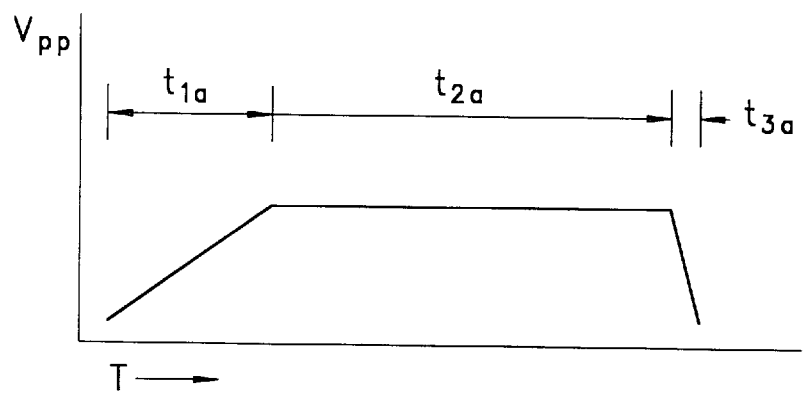
FIG. 2 is a graph of the program voltage $V_{pp}$ versus time for the method of charging and discharging a memory cell in accordance with the present invention.
Figure 3:
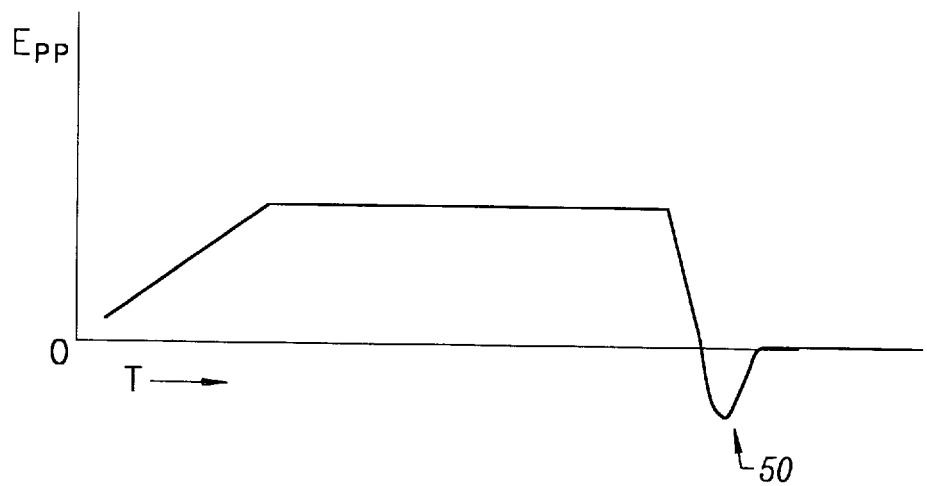
FIG. 3 is a graph of the electric field $V_{te}$ on the floating gate of the transistor corresponding to the same time frame represented in FIG. 2 showing the corresponding electric field when the $V_{pp}$, is applied.

FIGS. 2 and 3 show the program voltage $V_{pp}$ as a function of time, and the electric field at the floating gate $E_{pp}$, as a function of time, respectively, for the method of the present invention. As shown in FIG. 2, the ramp-up time $T_{1a}$ is longer than the ramp-up time $T_1$ in the prior art method of programming the floating gate cell shown in FIG. 1C. Likewise, the fall time $T_{3a}$ is significantly shorter than fall time $T_3$ of the prior art method. As a result, as shown in FIG. 3, the electric field $E_{pp}$ across the floating gate has a markedly sharper fall time, and a reverse polarity electric field, shown at reference numeral 50, is generated by the rapid fall time $T_{3a}$ of $V_{pp}$.

In general, it is believed that charged oxide traps with energy in the oxide bandgap assist the electrons in tunneling through the oxide. It is these same oxide traps that increase the so-called low level leakage current and result in cell data loss. With the relatively fast $V_{pp}$ fall time shown in FIG. 2, the oxide is exposed to the small opposite polarity Fowler-Nordheim stress, and the oxide traps are neutralized and no longer can efficiently assist electron tunneling through the oxide. As a result, the leakage current is reduced.

It should be recognized that the time periods $T_1$, $T_{1a}$, $T_2$, $T_3$, and $T_{3a}$ will be dependent upon the particular structure of the array. Typically $T_{1a}$ in a method of the present invention will be one millisecond or longer, while $T_{3a}$ will be 50 microseconds or lower. It should be further recognized that $V_{pp}$ can be applied to the substrate or the gate, to the program or erase function (charge or discharge), of the floating gate. $T_2$ ($V_{pp}$) will again be determined by the parameters of the device but will generally be in a length from 10 to 100 milliseconds. The negative $E_{pp}$ will have a magnitude which is slightly lower than the $E_{pp}$ resulting from the applied $V_{pp}$. As should be understood by one of average skill in the art, the invention is not limited to the particular device dimensions set forth herein, and smaller scale devices using lower $V_{pp}$ levels are well within the scope of the present invention.

Figure 4:
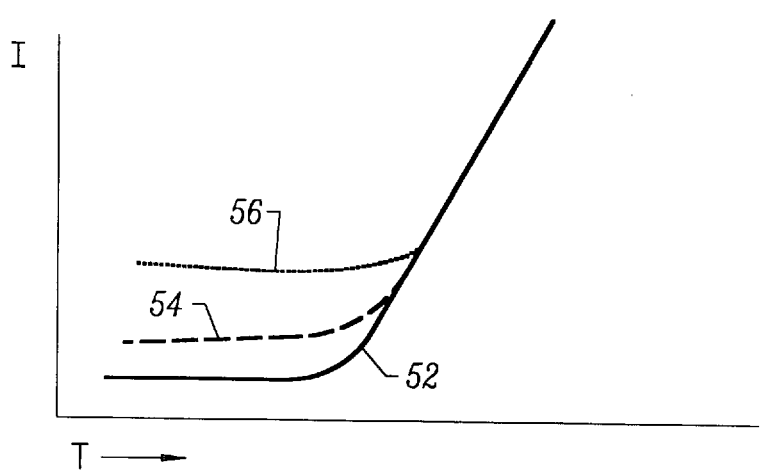
FIG. 4 is a graph of the low voltage leakage current versus time comparing the method of the present invention with the method of the prior art.

FIG. 4 shows the experimental results supporting the general proposition that a negative $V_{pp}$ (generating a negative $E_{pp}$ across the floating gate) will reduce leakage current. Line 52 indicates the initial leakage current over time. Dashed line 56 indicates the leakage current after the voltage pulse $V_{pp}$ is applied. In this case, an actual reverse polarity electric field was generated after $V_{pp}$ was applied. Line 54 indicates the leakage current after the negative electric field is applied.

Figure 5:
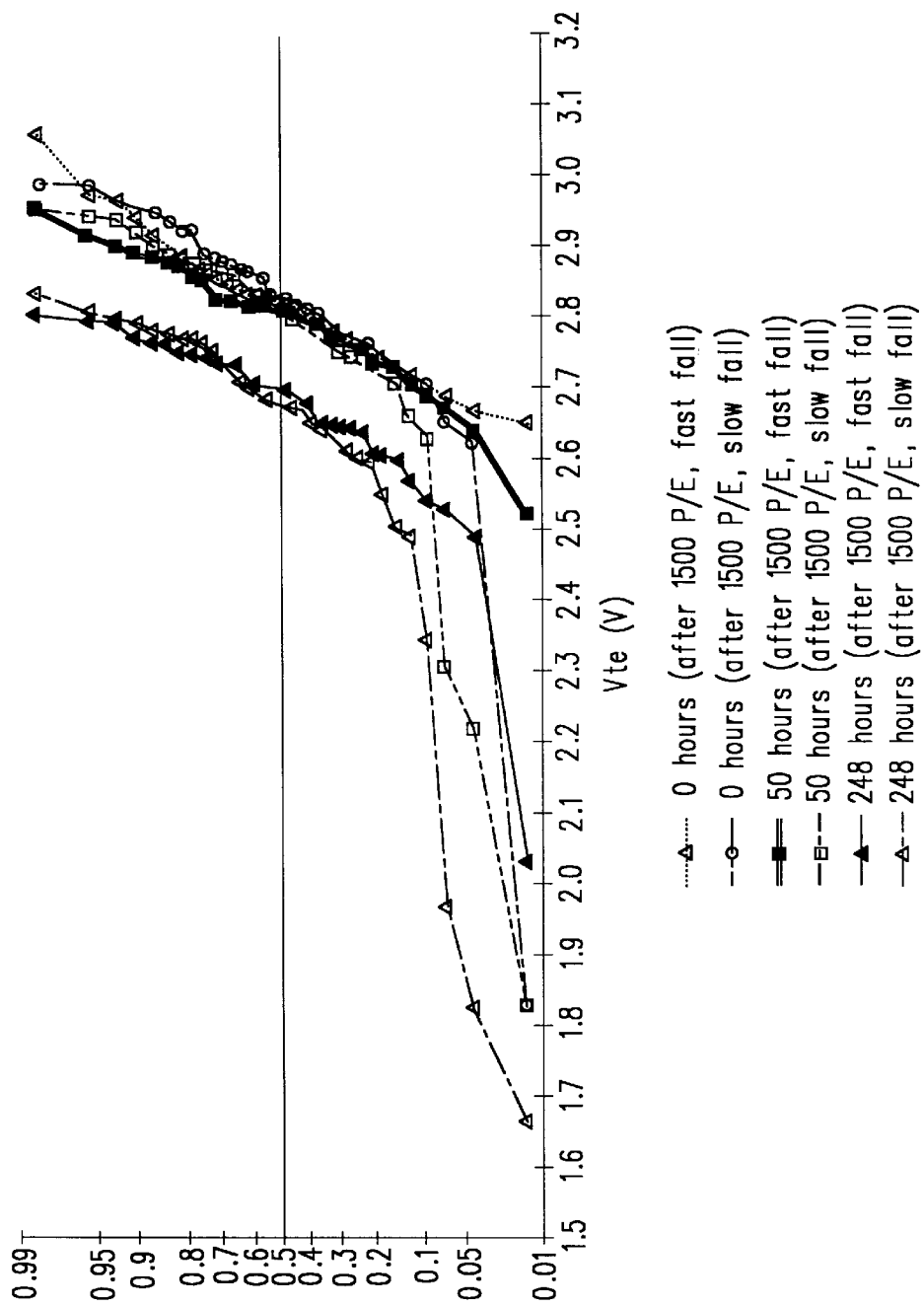
FIG. 5 is a graph of the probability plots of erase voltage ($V_{te}$) from a 4,000 cell array using different charge and discharge methods.

FIG. 5 is a probability plot of the erase voltage ($V_{te}$) for a 4k cell array with both slow and fast $V_{pp}$ fall times. As shown therein, as time passes, $V_{te}$ becomes small, suggesting that the cell is losing charge. It is noted from the plots that cell data retention is improved after using a fast $V_{pp}$ fall time.

The many features and advantages of the present invention will be apparent to one of average skill in the art. While the invention has been illustrated with respect to a double polysilicon gate transistor, it should be recognized that the invention may be utilized with any number of transistor configurations, including a single polysilicon gate transistor. All such features and advantages of the present invention are intended to be within the scope of the invention as defined by the attached claims.

What is claimed is:

1. A method for charging a floating gate of a floating gate transistor, the transistor including an active region adjacent to the floating gate with a tunnel dielectric disposed therein between, comprising:

applying a first potential to the active region; and applying a program voltage to the floating gate over a period of time and at a magnitude by, (A) increasing the program voltage from zero volts to the magnitude over a first period of at least 1 millisecond, (B) maintaining the program voltage at the magnitude for a second period sufficient to place charge on the floating gate, and (C) decreasing the program voltage from the magnitude during a third period to zero volts in not greater than 50 microseconds.

2. The method of claim 1 wherein the active region comprises a source or drain.

3. The method of claim 1 wherein the magnitude of the program voltage is in a range from 12 to 20 volts.

4. The method of claim 1 wherein the program voltage is 12 volts.

5. The method of claim 1 wherein the first potential is ground.

6. The method of claim 1 wherein said step (C) provides an electric field across the floating gate having a polarity opposite to an electric field formed during said steps (B) and (C).

7. A method for charging a floating gate of a floating gate transistor, the transistor including an active region disposed in a substrate and adjacent to the floating gate with a tunnel dielectric disposed between the floating gate and the active region, the method comprising:

applying a first voltage to the floating gate; and applying a program voltage to the active region for a period of time and at a magnitude, step of applying comprising the sub-steps of, (A) increasing the program voltage from zero volts to said magnitude during the first time period, (B) sustaining the magnitude during a second time period, and (C) decreasing the voltage from the magnitude to zero volts in a third time period;

wherein the first time period is on the order 20 times greater than the third time period.

8. The method of claim 7 wherein the first time period is about 100 milliseconds or more.

9. The method of claim 7 wherein the third time period is about 50 microseconds or less.

10. The method of claim 7 wherein the active region is a source.

11. The method of claim 7 wherein the active region is a drain.

12. The method of claim 7 wherein the first voltage is ground.

13. The method of claim 7 wherein said step (C) provides an electric field across the floating gate having a polarity opposite to an electric field formed during said steps (B) and (C).

14. A method for charging a floating gate transistor, the transistor including a control gate, a floating gate disposed below the control gate and overlying a substrates, with a tunnel dielectric disposed between the floating gate and the substrate, the method comprising:

applying a first voltage to the substrate; and applying a program voltage to the control gate for a period of time and at a magnitude, step of applying comprising the sub-steps of, (A) increasing the program voltage from zero volts to said magnitude during a first time period, (B) sustaining the magnitude during a second time period, and (C) decreasing the voltage from the magnitude to zero volts in a third time period;

wherein the first time period is on the order 20 times greater than the third time period.

15. The method of claim 14 wherein the first voltage is zero volts.

16. The method of claim 14 wherein the program voltage is about eight volts or greater.

17. The method of claim 14 wherein the first time period is about 10–100 ms. or more.

18. The method of claim 14 wherein the third time period is about 50 microseconds or less.

19. The method of claim 14 wherein said step (C) provides an electric field across the floating gate having a polarity opposite to an electric field formed during said steps (B) and (C).

* * * * *

UNITED STATES PATENT AND TRADEMARK OFFICE
CERTIFICATE OF CORRECTION

PATENT NO. : 5,841,701

DATED : November 24, 1998

INVENTOR(S) : Li, et al.

It is certified that error appears in the above-identified patent and that said Letters Patent is hereby corrected as shown below:

On the title page, item [54] and Column 1, line 2:
In the Title, delete "GAGE" and insert therefor --GATE--.

In the Claims, Column 6, line 3, delete "substrates" and insert therefor --substrate--.

Signed and Sealed this

Sixth Day of July, 1999

Attest:

Q. TODD DICKINSON

Attesting Officer

Acting Commissioner of Patents and Trademarks